United States Patent [19]
Marion et al.

[11] Patent Number: 5,496,769
[45] Date of Patent: Mar. 5, 1996

[54] PROCESS FOR COATING ELECTRONIC COMPONENTS HYBRIDIZED BY BUMPS ON A SUBSTRATE

[75] Inventors: François Marion, Saint Egreve; Michelle Boitel, Fontaine, both of France

[73] Assignee: Commissariat a l'Energie Atomique, France

[21] Appl. No.: 227,503

[22] Filed: Apr. 14, 1994

[30] Foreign Application Priority Data

Apr. 30, 1993 [FR] France ................. 93 05146

[51] Int. Cl.$^6$ ........................................... H01L 21/44
[52] U.S. Cl. ........................ 437/183; 437/211; 29/841
[58] Field of Search ............................ 437/183, 207, 437/211, 219, 224; 257/737; 228/180.22; 29/841, 855

[56] References Cited

U.S. PATENT DOCUMENTS

| | | | |
|---|---|---|---|
| 3,811,183 | 5/1974 | Celling | 29/588 |
| 4,567,505 | 1/1986 | Pease et al. | |
| 4,604,644 | 8/1986 | Beckham et al. | 437/211 |
| 4,871,921 | 10/1989 | Gurnee | 257/737 |
| 5,120,678 | 6/1992 | Moore et al. | 437/183 |

FOREIGN PATENT DOCUMENTS

| | | |
|---|---|---|
| 7203793 | 4/1972 | France . |
| 59-152652 | 8/1984 | Japan . |
| 03006828 | 1/1991 | Japan . |
| 3261154 | 11/1991 | Japan . |

OTHER PUBLICATIONS

IBM Technical Disclosure Bulletin vol. 33, No. 7 Dec. 1990 Method to Shield the Exposed Sites Near a Chip During Encapsulation of C-4 Chip Joints in a Second Level Packaging Assembly.

Primary Examiner—George Fourson
Assistant Examiner—Thomas G. Bilodeau
Attorney, Agent, or Firm—Cesari and McKenna

[57] ABSTRACT

The invention relates to a process for coating electronic components mounted on a substrate using a bump or ball hybridization method. It also relates to the coated electronic component obtained by performing this process. The process comprises placing bumps on the substrate, around an electronic component in order to form a bump belt or carpet contiguous with said electronic component and depositing at least one drop of a coating substance on said bump belt, the bumps of the belt impregnated with the substance being able to make said substance migrate by capillarity towards the bumps located between said electronic component and said substrate. The invention has applications in microelectrics, data processing and optoelectronics.

3 Claims, 1 Drawing Sheet

5,496,769

PROCESS FOR COATING ELECTRONIC COMPONENTS HYBRIDIZED BY BUMPS ON A SUBSTRATE

DESCRIPTION

1. Technical Field

The present invention relates to a process for coating electronic components hybridized by bumps, balls or spheres on a substrate. It also relates to the coated electronic component obtained by performing this process. It has numerous applications in the fields of microelectronics, data processing, optoelectronics and microsensors.

2. Prior Art

The aim is to increasingly miniaturize electronic or data processing systems using integrated circuits. With a view to obtaining dense, complex circuits, it is known to eliminate the electronic cases or packages around the chips and directly hybridize the chips with solder bumps on the multilayer substrates producing the interconnections between the chips. This procedure known as the flip-chip procedure leads to the hybridization of hundreds of chips on ceramic substrates, known as a multi-chip module. It is e.g. described in IBM patent US-A-4 202 007 and in FR-A-2 611 986 (Thomson Semiconducteurs).

The increase, as a result of this bump hybridization method, of the number of components per substrate surface unit requires increased attention to the problems of the mechanical behavior of the resulting circuits. A process for improving the mechanical strength of such circuits is known from the article entitled "Development of a high reliability flip-chip packaging reinforced by resin" published in "Electronics and Communications in Japan ", part 2, vol. 71, no. 11, 1988, p. 19 and in the document "Flip chip solder bump fatigue life enhanced by polymer encapsulation", in "Proceedings of the 40th Electronic Components and Technology Conference", 1990, p.338.

The process described in these documents involves the coating of electronic components. This process consists of depositing a calibrated drop of a coating substance such as a coating resin (referred to hereinafter for simplification purposes by the term resin). This calibrated resin drop is deposited close to the electronic component hybridized by bumps, said electronic component being in most cases a chip. The resin drop deposited close to the electronic component migrates by capillarity beneath the said component, i.e. the resin drop migrates towards the hybridized component bumps located between the component and the substrate.

FIGS. 1A and 1B show a substrate 3 on which is fitted an electronic component 1 hybridized by bumps (referred to for simplification reasons as hybridized component). FIG. 1A shows a resin drop 7 deposited in the vicinity of the electronic component 1. This resin drop 7 must be calibrated in such a way that the resin quantity therein is sufficiently large to migrate by capillarity towards the bumps of the hybridized component 1, i.e. to migrate by capillarity between the bumps 5 positioned between the component 1 and the substrate 3.

FIG. 1A shows said same substrate 3 on which is fitted the component 1 hybridized by the bumps 5. FIG. 1B shows the resin drop 7, which has migrated beneath the hybridized component 1. By its very nature, the resin used has a low viscosity and therefore has a tendency to easily spread. In addition, the surplus resin 7 which has not penetrated between the bumps 5 of the hybridized component 1 spreads on either side of the latter. Therefore the resin drop 7 must be correctly calibrated in such a way that the resin quantity contained therein is sufficiently large to entirely fill the space contained between the hybridized component 1 and the substrate 3, but not excessive in such a way that the resin spreads to a too great extent around said hybridized component 1, as is shown in FIG. 1B. Moreover, in order to limit said undesired spread of the resin around the hybridized component 1, the resin drop 7 must be very accurately deposited on the edge of the hybridized component 1. Thus, if the resin drop 7 has an excessive volume, the resin may spread to a significant extent around the component 7 and therefore cover zones close to the component 1 and which should not in fact be covered. This is e.g. the case for substrates on which are fitted multi-chip modules or zones having pointed test pads, which must not be covered with resin.

DESCRIPTION OF THE INVENTION

The present invention aims at obviating the disadvantages referred to herein-before. For this purpose, it proposes a process for coating a component hybridized by bumps on a substrate, in which the location of the resin can be controlled during and after the coating operation of said hybridized component.

More specifically, the invention relates to a process for coating electronic components fitted on a substrate using a bump hybridization procedure. This process consists of placing the bumps on the substrate, around an electronic component in order to form a carpet or belt of bumps contiguous to said electronic component and depositing at least one drop of a coating substance on the bump belt, the bumps of the belt impregnated with the substance being able to make the latter migrate by capillarity towards the bumps positioned between said electronic component and said substrate.

Such a bump belt makes it possible to check the location of the resin remaining confined within the belt. It also makes it possible to deposit the substance drop with a very broad positioning tolerance, the drop being depositable at any random location of said bump belt.

Advantageously, said process consists of choosing the dimensions of the bump belt as a function of the resin quantity to be deposited there.

The process can also consist of producing the belt of bumps with bumps having variable dimensions, so that the capillarity force intensifies from the outer edge of the belt towards the bumps located between the electronic component and the substrate.

The invention also relates to a coated electronic component fitted to a substrate in accordance with a bump hybridization procedure and which is characterized in that it is at least partly surrounded by a belt of bumps located on the substrate in contiguous manner to the hybridization bumps and impregnated with a coating substance.

DETAILED DESCRIPTION OF EMBODIMENTS

Figure 1A:
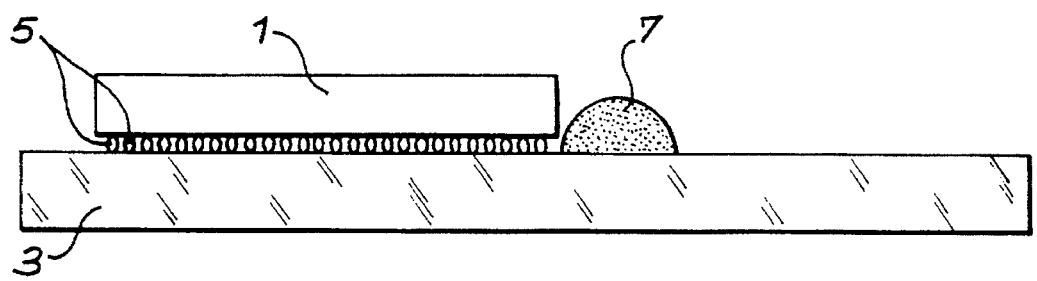
FIG. 1A, already described, an electronic component hybridized by bumps and alongside which is placed the resin drop permitting its coating in a known way.
Figure 1B:
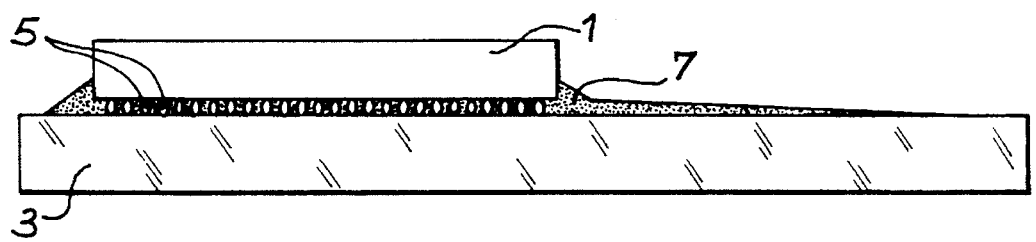
FIG. 1B, already described, the electronic component hybridized by bumps coated with a resin in the known way.
Figure 2A:
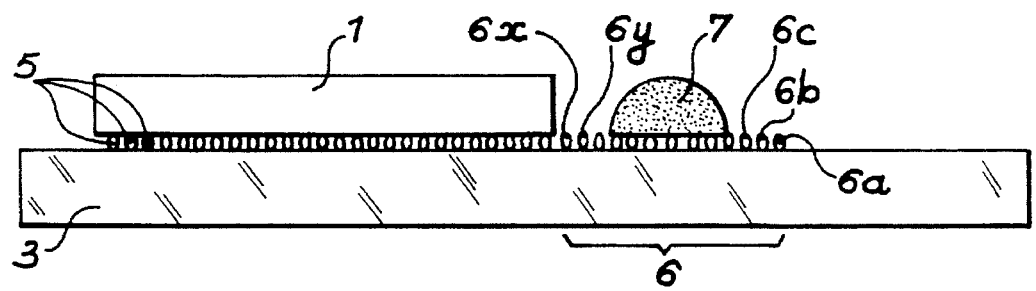
FIG. 2A an electronic component hybridized by bumps and surrounded by a bump belt on which is deposited a resin drop.
Figure 2B:
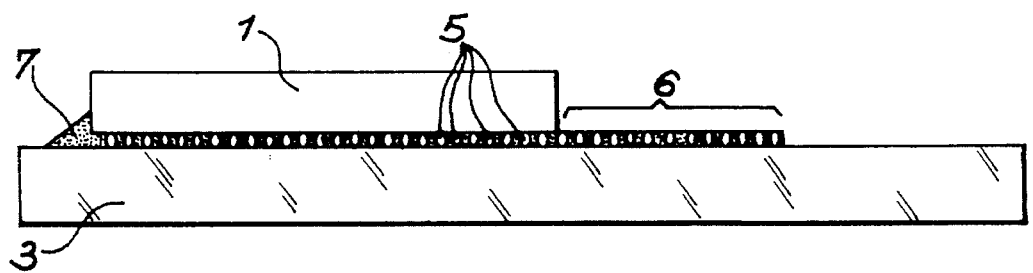
FIG. 2B an electronic component hybridized by bumps and coated with a resin layer according to the invention.

An embodiment of the invention is shown in FIGS. 2A and 2B. FIG. 2A shows the hybridized component 1 mounted on the substrate 3 in accordance with a hybridization by bumps 5. FIG. 2A shows the carpet or belt 6 of bumps produced by means of a plurality of bumps (6a, 6b, 6c, etc.) identical to the bumps 5 of the hybridized component 1. This bump belt 6 is positioned contiguous to the bumps 5 of the hybridized component 1. Thus, a resin drop 7 can be deposited on the bump belt 6. This resin 7 can then reach all the bumps within the belt 6, as well as all the bumps of the surface below the hybridized component 1, under the effect of capillarity forces. Therefore the resin is retained by the capillarity forces within the confines of the bump belt 6.

The resin drop can be deposited at any random location of the bump belt 6. This resin drop 7 is then automatically drawn in by the bump belt 6 and directed towards the contiguous hybridized component 1 beneath which the resin is also drawn in, by capillarity, by the bumps of the hybridized component 1. The excess resin dispensed remains confined within the bump belt 6, thus permitting a perfect control of the operation.

FIG. 2B shows the hybridized component 1 surrounded by the bump belt 6 which has been penetrated by the resin 7. The hybridized component 1 is then coated with the resin 7 in accordance with a controlled location. Thus, as can be seen from FIG. 2B, all the resin 7 is absorbed by bumps 5 of the hybridized component 1 and the belt.

Advantageously, the bumps of the belt 6 can have different dimensions, so as to favor the diffusion effects by capillarity of the resin 7. Preferably, the bumps 6a, 6b, 6c etc. located on the outer part of the belt 6 are smaller than the bumps 6x, 6y etc. located on that part of the belt 6 which is contiguous to the hybridized component 1. It is therefore possible to limit the extension of the resin 7 around the hybridized component 1, i.e. limit the size of the belt 6 by using, for the formation of the belt, bumps having a sufficiently large height.

It is also possible to control or check the thickness of the resin 7 around the hybridized component 1 by choosing the height of the bumps to be used for producing the belt 6. If it is wished to obtain a constant resin thickness, the bumps used for producing the belt 6 must have an identical size.

Therefore the process according to the invention permits a perfect control of the distribution of the coating resin during and after the coating operation, the zones having the resin around the hybridized component 1 being perfectly controlled.

The process according to the invention also makes it possible to deposit the resin drop 7 at a not particularly specific point. The resin drop 7 can consequently be deposited far from the hybridized component 1, while still being deposited on the belt 6, and with very wide positioning tolerances, the capillarity forces ensuring the spread of the resin towards the bumps of the hybridized component 1.

In exemplified manner and to provide a better understanding of the invention, reference can be made to the case of a hybridized component having a surface of 1 cm×1 cm hybridized onto a substrate by bumps having a height of 50 µm, whereby the bumps can generally have a height of 1 to 200 µm. The minimum volume of the resin drop to be dispensed is then 5 mm$^3$. After coating the hybridized component, the resin residue would extend up to 7 mm if there was no bump belt. According to the invention, the bump belt 6 limits the extension of the resin to 4 mm.

As will have been made clear the said process makes it possible to obtain all types of geometry for the bump belt.

According to a variant of the invention, the bump belt can be produced during the same technological operations as those making it possible to produce the hybridization bumps of the hybridized component, no supplementary technological stage being required.

These bumps can e.g. be produced by the electrolytic growth of a layer of a material having a low melting point (e.g. Sn-Pb) above a wettable surface (e.g. a gold surface) having a smaller area. These bumps can then be shaped by melting the material, the surface tension forces forming the bumps soldered to the wettable surface. Embodiments of these bumps used for the hybridization of electronic components are described in the documents cited hereinbefore.

We claim:

1. A process for coating electronic components fitted on a substrate using a bump hybridization procedure, characterized in that it comprises placing the bumps on the substrate adjacent to an electronic component in order to form a carpet of bumps contiguous to bumps between said electronic component and said substrate and depositing at least one drop of a coating substance on the bump carpet, the bumps of the carpet impregnated with the substance being able to make said substance migrate by capillarity toward the bumps located between the electronic component and said substrate.

2. The process according to claim 1, characterized in that it consists of determining the substance quantity to be deposited on said bump carpet, and choosing the dimensions of the bump carpet so that said substance quantity substantially fills the spaces between the bumps located between said electronic component and said substrate.

3. The process according to claim 1, characterized in that it consists of producing the bump carpet with bumps having variable dimensions, in order to ensure a more intense capillarity force from an outer edge of the carpet towards the bumps located between the electronic component and the substrate as compared to a process in which the bumps have the same dimensions.

* * * * *